US008227332B2

(12) United States Patent
Coffy et al.

(10) Patent No.: US 8,227,332 B2
(45) Date of Patent: Jul. 24, 2012

(54) METHOD FOR FABRICATING ELECTRICAL BONDING PADS ON A WAFER

(75) Inventors: Romain Coffy, Saint Matrin le Vinoux (FR); Jacky Seiller, Veurey-Voroize (FR); Gil Provent, Coublevie (FR)

(73) Assignee: STMicroelectronics (Grenoble) SAS, Grenoble (FR)

( * ) Notice: Subject to any disclaimer, the term of this patent is extended or adjusted under 35 U.S.C. 154(b) by 155 days.

(21) Appl. No.: 12/262,982

(22) Filed: Oct. 31, 2008

(65) Prior Publication Data
US 2009/0134514 A1 May 28, 2009

(30) Foreign Application Priority Data
Nov. 23, 2007 (FR) ...................................... 07 59273

(51) Int. Cl.
*H01L 21/44* (2006.01)
(52) U.S. Cl. ........ 438/613; 438/612; 438/614; 257/737; 257/E21.508; 257/E23.021
(58) Field of Classification Search .................. 257/737, 257/E23.021, E21.508; 438/612, 613, 614
See application file for complete search history.

(56) References Cited

U.S. PATENT DOCUMENTS

| 3,661,730 | A | * | 5/1972 | Nishihara ..................... 205/253 |
| 3,770,874 | A | * | 11/1973 | Krieger et al. ................ 174/257 |
| 6,042,953 | A | | 3/2000 | Yamaguchi et al. |
| 6,329,608 | B1 | * | 12/2001 | Rinne et al. .................... 174/261 |
| 6,372,622 | B1 | * | 4/2002 | Tan et al. ....................... 438/612 |
| 6,555,296 | B2 | | 4/2003 | Jao et al. |
| 6,759,319 | B2 | * | 7/2004 | Viswanadam et al. ........ 438/613 |
| 6,784,089 | B2 | | 8/2004 | Lei et al. |
| 6,930,031 | B2 | | 8/2005 | Huang |
| 7,180,005 | B2 | * | 2/2007 | Urano ........................... 174/255 |
| 7,189,646 | B2 | | 3/2007 | Huang |
| 7,271,483 | B2 | | 9/2007 | Lin et al. |
| 7,459,386 | B2 | | 12/2008 | Tseng et al. |
| 2002/0017553 | A1 | | 2/2002 | Jao |
| 2002/0137325 | A1 | | 9/2002 | Shao |
| 2002/0146646 | A1 | | 10/2002 | Jao et al. |
| 2003/0164395 | A1 | | 9/2003 | Tong et al. |
| 2008/0258305 | A1 | | 10/2008 | Lee et al. |

FOREIGN PATENT DOCUMENTS

| DE | 10132158 | 1/2003 |
| EP | 0899787 | 3/1999 |
| GB | 1536772 | 12/1978 |

OTHER PUBLICATIONS

French Search Report, FR 0759273, Jul. 1, 2008.

* cited by examiner

*Primary Examiner* — Robert Huber
(74) *Attorney, Agent, or Firm* — Gardere Wynne Sewell LLP

(57) ABSTRACT

A method for fabricating electrical bonding pads on one face of a wafer includes the production of electrically conductive areas and electrical connection branches connecting these conductive areas. A layer of mask material is deposited and openings are produced in this mask layer which extend above said conductive areas and at least some of which extend at least partly beyond the peripheral edges of the underlying conductive areas. Blocks made of a solder material are produces in the openings by electrodeposition in a bath. The mask material is then removed along with the connection branches. The wafer is passed through or placed in an oven so as to shape, on the conductive areas, the blocks into substantially domed electrical bonding pads.

9 Claims, 10 Drawing Sheets

METHOD FOR FABRICATING ELECTRICAL BONDING PADS ON A WAFER

PRIORITY CLAIM

The present application is a translation of and claims priority from French Application for Patent No. 07 59273 of the same title filed Nov. 23, 2007, the disclosure of which is hereby incorporated by reference.

BACKGROUND OF THE INVENTION

1. Technical Field of the Invention

The present invention relates to the field of semiconductor electronic devices and components, and more particularly to the field of producing the electrical bonding pads of such devices and components.

2. Description of Related Art

Bonding pads are provided on the semiconductor wafer in order to allow for the integrated circuit to make external packaging circuit connections. There is a need in the art for an improved method for forming bonding pads which can take on any of the following selected shapes: elongated in shape and domed, forming bars, and approximately circular or polygonal in shape and domed, forming balls.

SUMMARY OF THE INVENTION

According to one embodiment, a method for fabricating electrical bonding pads on a wafer is proposed. This method comprises: production of electrically conductive areas and electrical connection branches connecting these areas; deposition of a layer of mask material; production of openings in this mask layer which extend above said conductive areas and at least some of which extend at least partly beyond the peripheral edges of the underlying conductive areas; production of blocks made of a solder material in said openings by electrodeposition in a bath; removal of the mask material; cutting of the connection branches; and passage through or placement in an oven so as to shape, on the conductive areas, said blocks into substantially domed electrical bonding pads.

According to an exemplary embodiment, the walls of at least some of the openings may extend all around and a distance from the peripheral edges of the underlying conductive areas.

According to another exemplary embodiment, the walls of the openings may pass through the transitional parts of the branches and the conductive areas.

According to another exemplary embodiment, the method may possibly comprise the production, in the layer made of mask material, of at least two groups of openings having openings of different shapes, the quantities of solder material of said blocks being such that the heights of the pads obtained are approximately the same from one pad to another.

According to another exemplary embodiment, the method may possibly comprise the production, in the layer made of mask material, of a group of openings of elongated shape over conductive areas of elongated shape and a group of openings of circular or polygonal shape over conductive areas of the same shape, the openings of an elongated shape being larger than the underlying conductive areas of elongated shape.

In another embodiment, a wafer is equipped on one face with electrically conductive areas capable of being connected by electrical connection branches and with blocks made of solder material formed on the conductive areas. At least some of said blocks are able to extend at least partly beyond the edges of the underlying conductive areas.

In another embodiment, a method for fabricating electrical bonding pads on one face of a wafer comprises: producing first and second electrically conductive areas and an electrical connection branch connecting these first and second electrically conductive areas; depositing a layer of mask material; producing a first opening in this mask layer above and of a same size and shape as the first electrically conductive area; producing a second opening in this mask layer above and having a size and shape extending at least partly beyond peripheral edges of the second electrically conductive area; producing first and second blocks made of a solder material filling in said first and second openings by electrodeposition in a bath; removing the mask layer and connection branch; and heating so as to shape the first and second blocks into substantially domed electrical bonding pads having approximately a same height.

In another embodiment, a method for fabricating electrical bonding pads on one face of a wafer comprises: producing first and second electrically conductive areas; depositing a layer of mask material; producing a first opening in this mask layer above and of a same size and shape as the first electrically conductive area; producing a second opening in this mask layer above and having a size and shape extending at least partly beyond peripheral edges of the second electrically conductive area; filling the first and second openings to produce first and second blocks made of a solder material; removing the mask layer; and heating so as to shape the first and second blocks into first and second substantially domed electrical bonding pads having a shape corresponding the underlying first and second electrically conductive areas.

BRIEF DESCRIPTION OF THE DRAWINGS

The present invention will now be illustrated, by way of non-limiting examples, through a description of embodiments of electrical bonding pads with reference to the drawings in which.

DETAILED DESCRIPTION OF THE DRAWINGS

Figure 1:
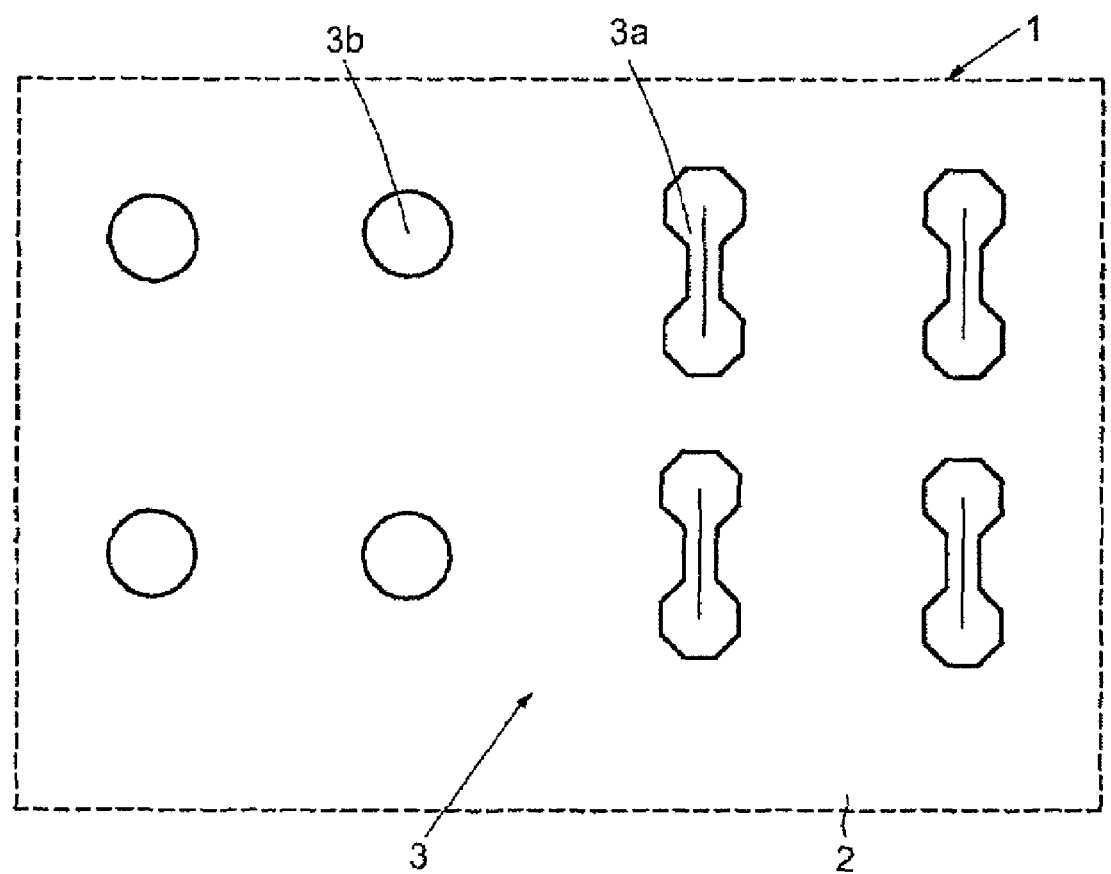
FIG. 1 shows a front view of a wafer provided with electrical bonding pads.

In FIG. 1, a wafer 1 is shown which has, on its front face 2, an array 3 of electrical bonding pads which are selectively connected to an integrated electronic circuit in the wafer 1 and which includes a group of electrical bonding pads 3*a* that are approximately elongated in shape and domed, forming bars, and a group of electrical bonding pads 3*b* that are approximately circular or polygonal in shape and domed, forming balls, although it is possible to comprise only one of these groups.

The electrical bonding pads 3 may be obtained in the following manner, by implementing the methods and means currently used in microelectronics.

Figure 2:
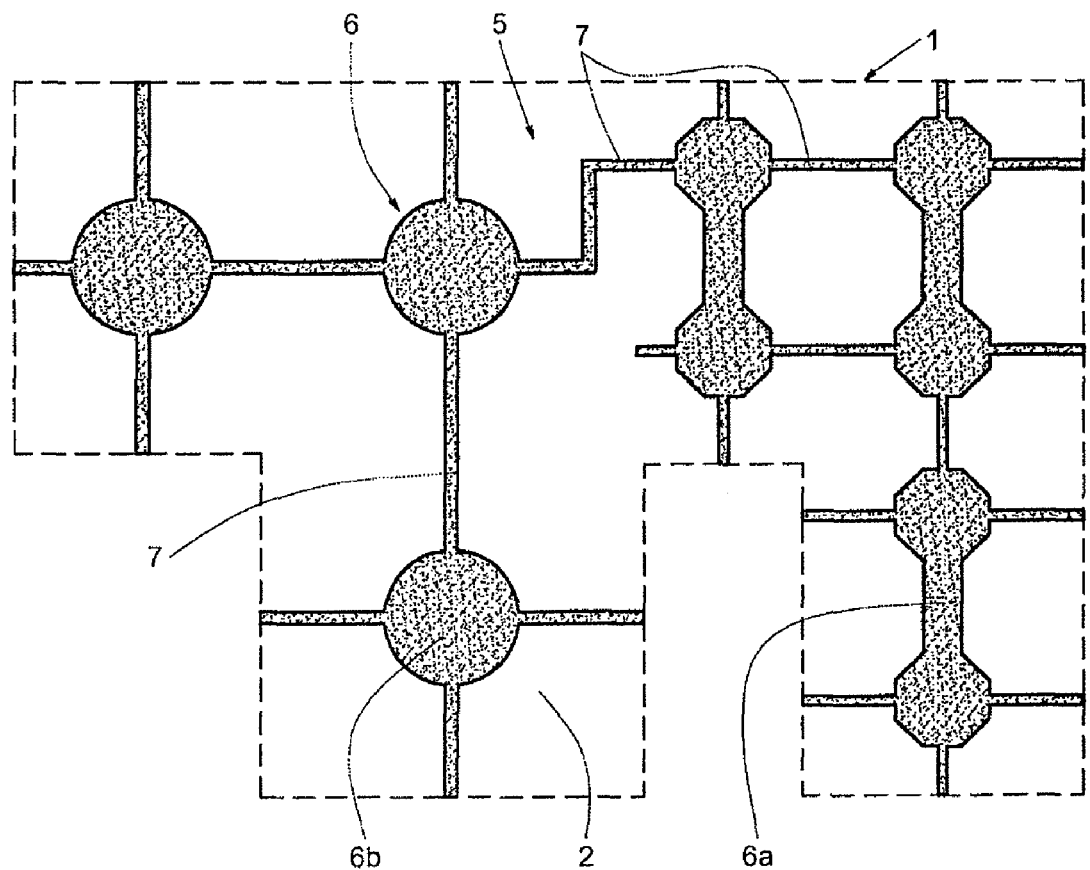
FIG. 2 shows a front view of said wafer according to a fabrication step.
Figure 3:
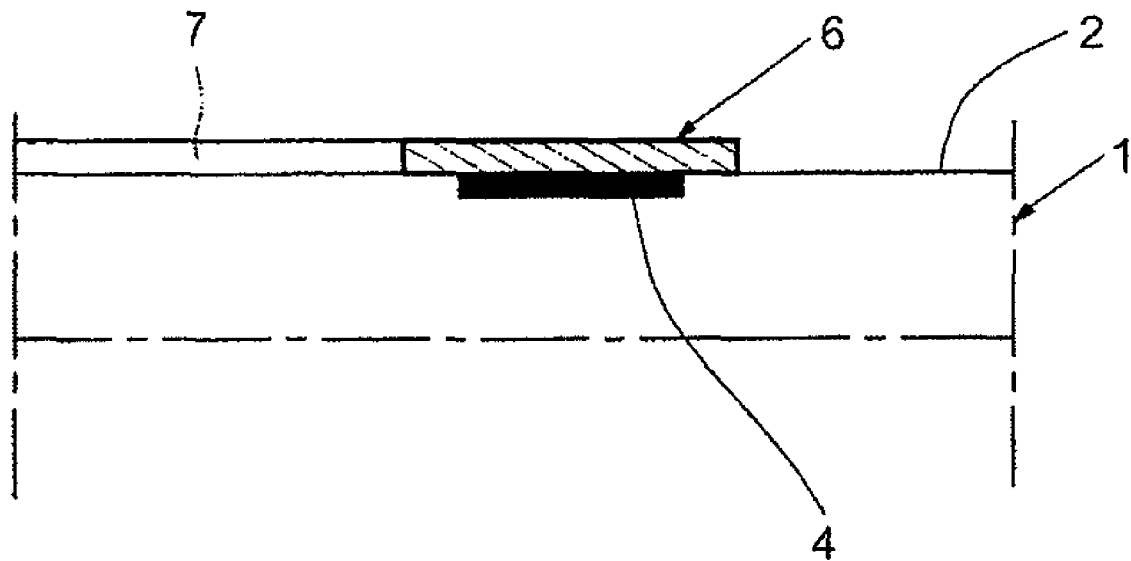
FIG. 3 shows a partial section of the wafer of FIG. 2.

As FIGS. 2 and 3 show, starting with the wafer 1, which has limited electrical contact areas 4 in its front face 2 that are selectively connected to said integrated electronic circuit, a structure 5 made of an electrically conductive material (UBM) corresponding to or above the contact surfaces 4 is produced on the front face 2, which structure comprises conductive areas 6 and a multiplicity of conductive branches 7 which connect the conductive areas 6. More precisely, the conductive areas 6 comprise conductive areas 6a of approximately elongated shape and conductive areas 6b of approximately circular or polygonal shape. The conductive areas 6a may have an elongated central part and enlarged end parts, giving them approximately the shape of a symmetric bone, it being possible for these enlarged parts to have curved and/or segmented edges.

To do this, a base layer made of at least one electrically conductive material also serving as a UBM, for example a TiCuNi alloy or any other alloy, is deposited on the front face 2 by known means. A layer of mask material is deposited on this base layer and openings are produced in this mask layer, preserving the mask material only over the areas corresponding to the conductive areas 6 and to the conductive branches 7 to be produced. For example, chemical etching is used to remove the conductive material of the base layer through the openings above, then the entire mask layer is removed.

Figure 4:
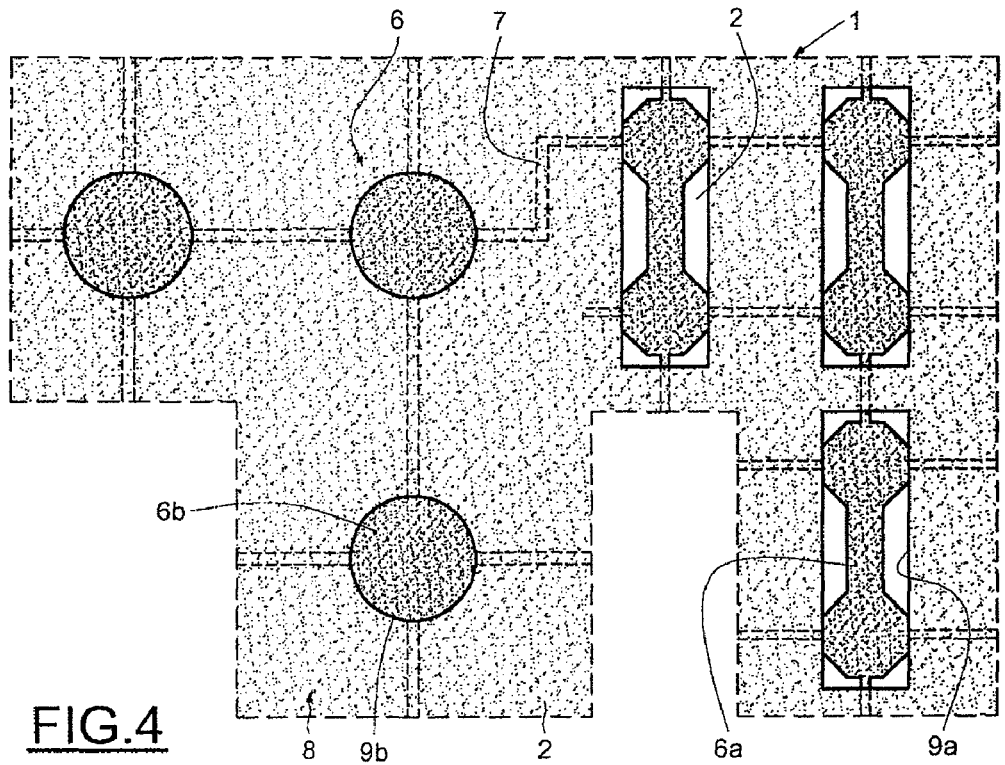
FIG. 4 shows a front view of said wafer according to another fabrication step.
Figure 5:
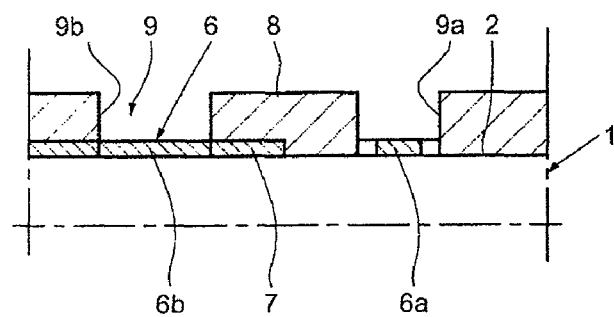
FIG. 5 shows a partial section of the wafer of FIG. 4.

Next, as FIGS. 4 and 5 show, a layer 8 made of mask material is deposited on the front face 2 and over the conductive areas 6 and the conductive branches 7. Then openings 9 above the conductive areas 6 are produced in this mask layer 8. These openings 9 comprise openings 9a at the locations of the elongated conductive areas 6a and openings 9b at the locations of the conductive areas 6b.

According to this example, the openings 9a are sections in the shape of rectangles, the long sides of which are flush with the lateral sides of the enlarged end parts of the conductive areas 6a and the small sides of which are beyond and at a distance from the ends of the conductive areas 6a, while the openings 9b are circular or polygonal sections corresponding to the conductive areas 6b.

Figure 6:
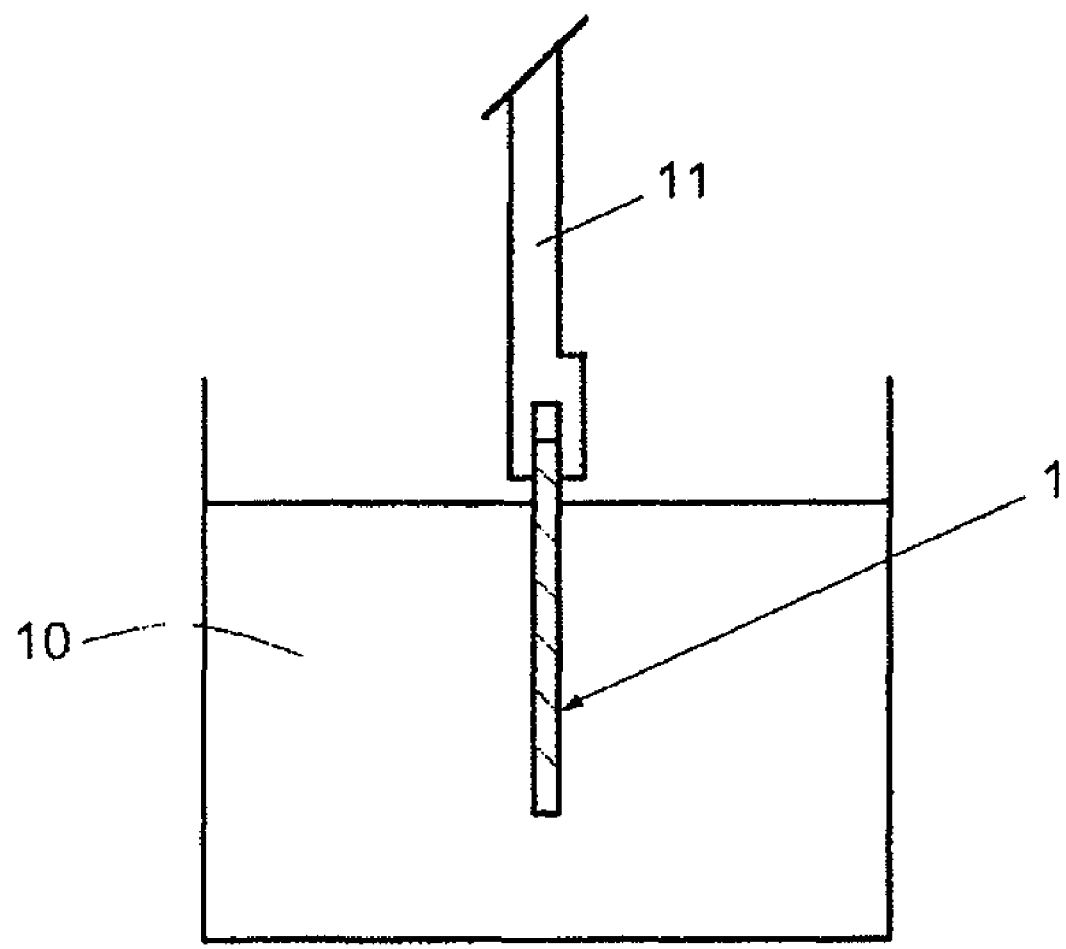
FIG. 6 shows a bath receiving the wafer of FIGS. 4 and 5.

Next, as FIG. 6 shows, the wafer 1 is immersed in an electrolytic bath 10 to bring about electrodeposition of a solder material in the openings 9, the conductive structure 5 being connected for this to an electric potential in order to form an electrode, for example by means of one or more contact devices 11 in contact with one or more uncovered conductive areas 6c of the structure 5 dedicated to this end and provided at the periphery of the front face 2 of the wafer 1.

In particular, the solder material may, for example, be made of an alloy of tin, silver, copper and/or lead.

Figure 7:
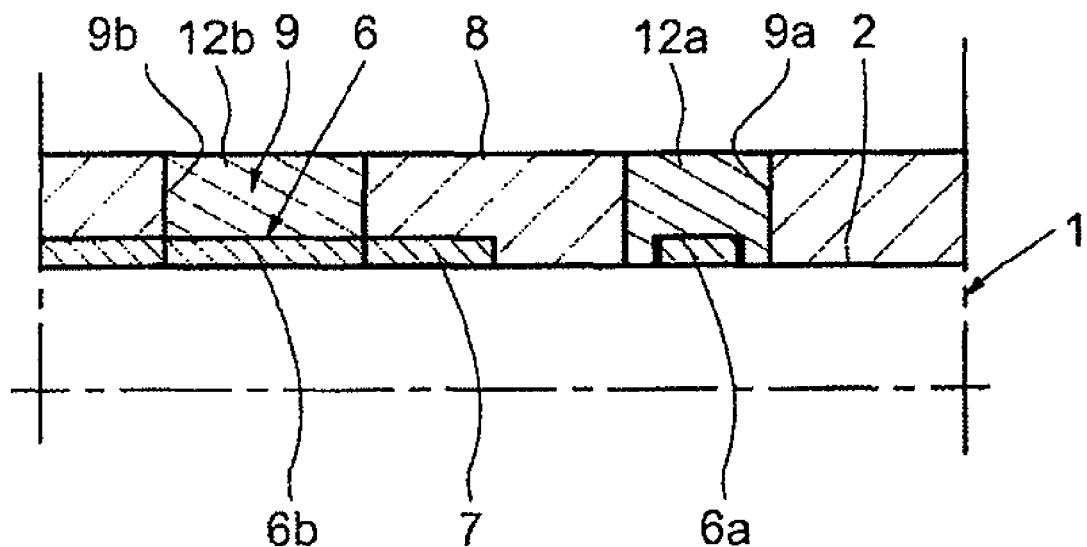
FIG. 7 shows a partial section of said wafer according to another fabrication step.

At the end of the electrodeposition, as FIG. 7 shows, blocks 12a which at least partially fill the openings 9a and blocks 12b which at least partially fill the openings 9b are obtained.

Figure 8:
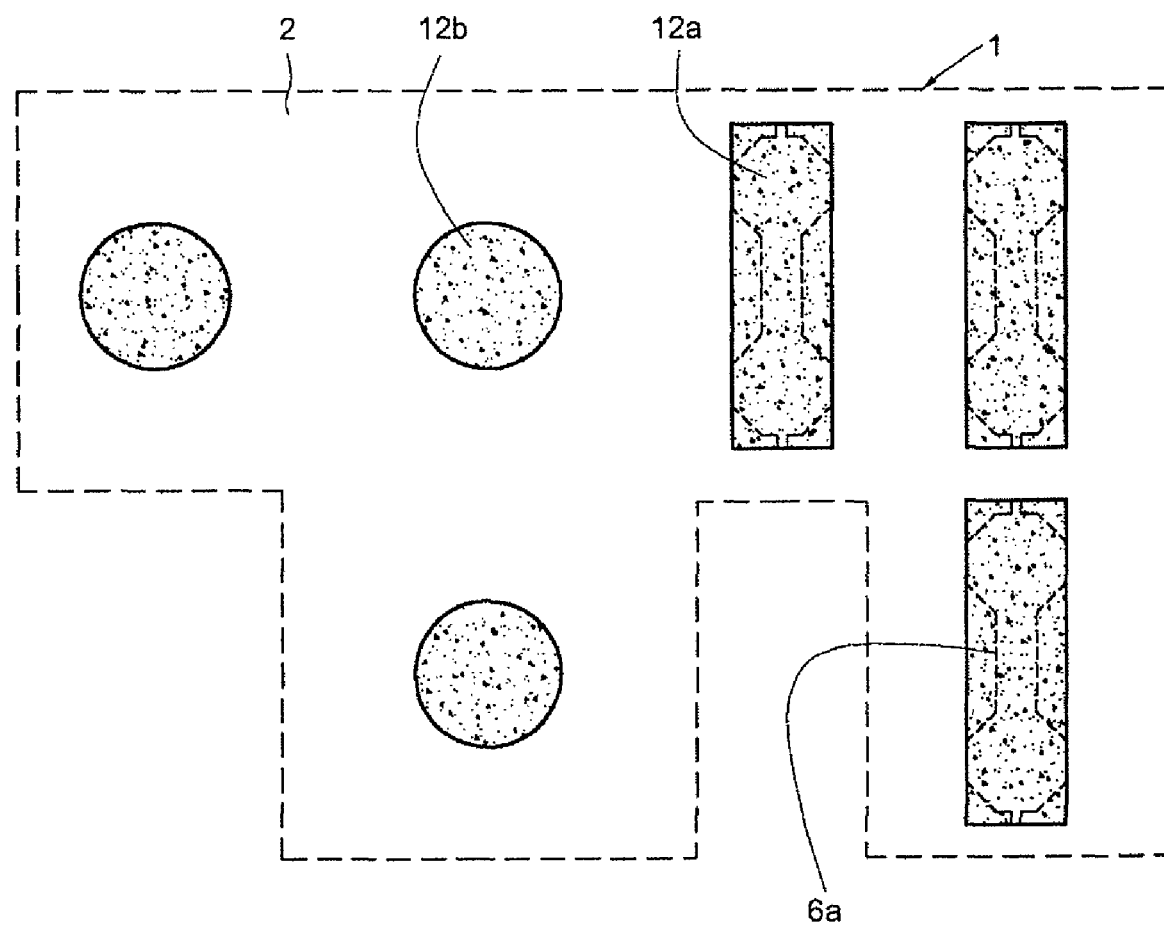
FIG. 8 shows a front view of said wafer according to another fabrication step.
Figure 9:
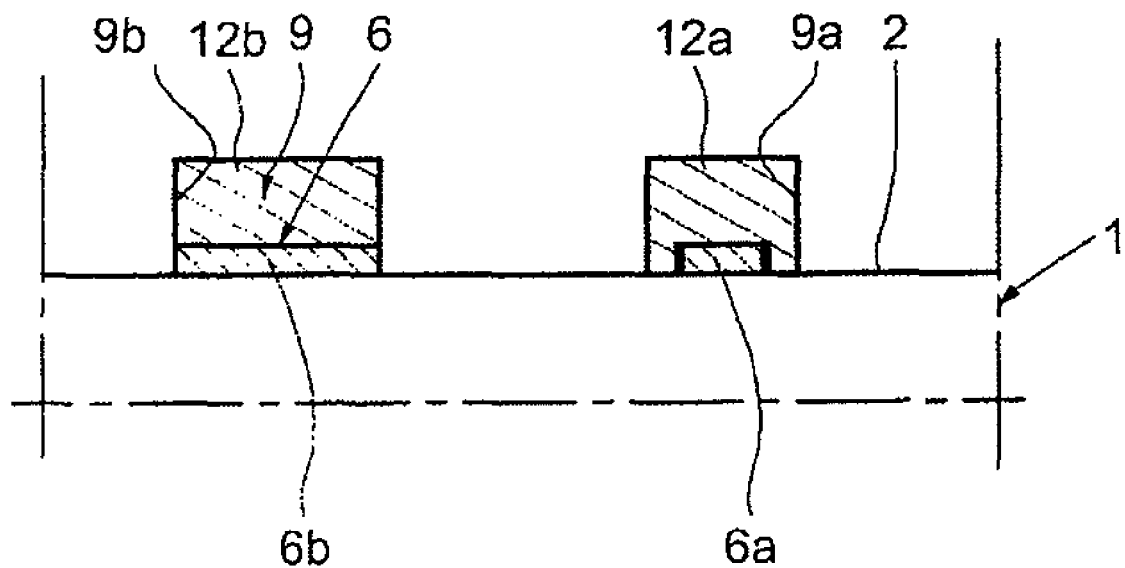
FIG. 9 shows a partial section of the wafer of FIG. 8.

Next, as FIGS. 8 and 9 show, the mask layer 8 is removed and, by using the blocks 12a and 12b as a mask, the conductive branches 7 or the parts of these branches between the blocks 12a and 12b are removed so as to disconnect the conductive areas 6a and 6b, for example by chemical etching.

Figure 10:
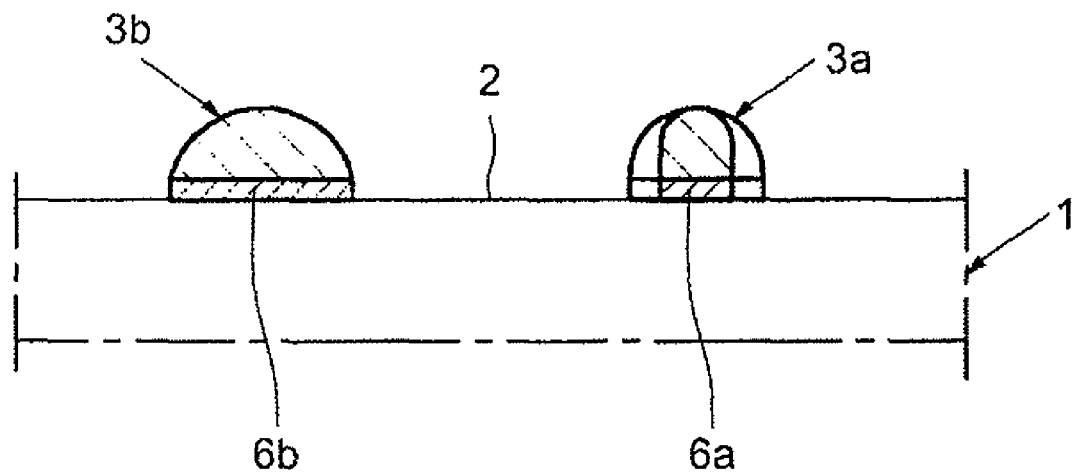
FIG. 10 shows a partial section of the wafer of FIG. 1.

The wafer 1 is then placed in or passed through an oven at a temperature such that, by rapid melting, plastic flow and the surface tension effect, the blocks 12a and 12b form, as FIGS. 1 and 10 show, into approximately domed electrical bonding pads 3a and 3b, above the conductive areas 6a and 6b, as the solder material does not adhere to the front face 2 of the wafer 1.

The shapes, sizes and volumes of the solder material of the blocks 12a may, according to a variant embodiment, be adapted so that the bar-shaped electrical bonding pads 3a obtained have apex lines approximately parallel to the front face 2 of the wafer 1.

The shapes, sizes and volumes of the solder material of the blocks 12a and 12b may, according to a variant embodiment, be adapted so that the electrical bonding pads 3a and 3b correspondingly obtained have approximately the same height.

According to the example that has just been described, the conductive areas 6a are connected to connection branches 7 that extend from the sides of their enlarged end parts, with the result that the walls of the openings 9a made in the mask layer 8, and consequently the walls of the blocks 12a, pass in the transitional parts of these branches into the conductive areas 6a and that these connection branches are completely removed during the chemical etching of the latter. Nonetheless, the conductive areas 6a are connected to other connection branches 7 that extend from their opposing ends, which are inside the openings 9a, with the result that short portions of these other branches subsist under blocks 12a after chemical etching of the latter.

Figure 11:
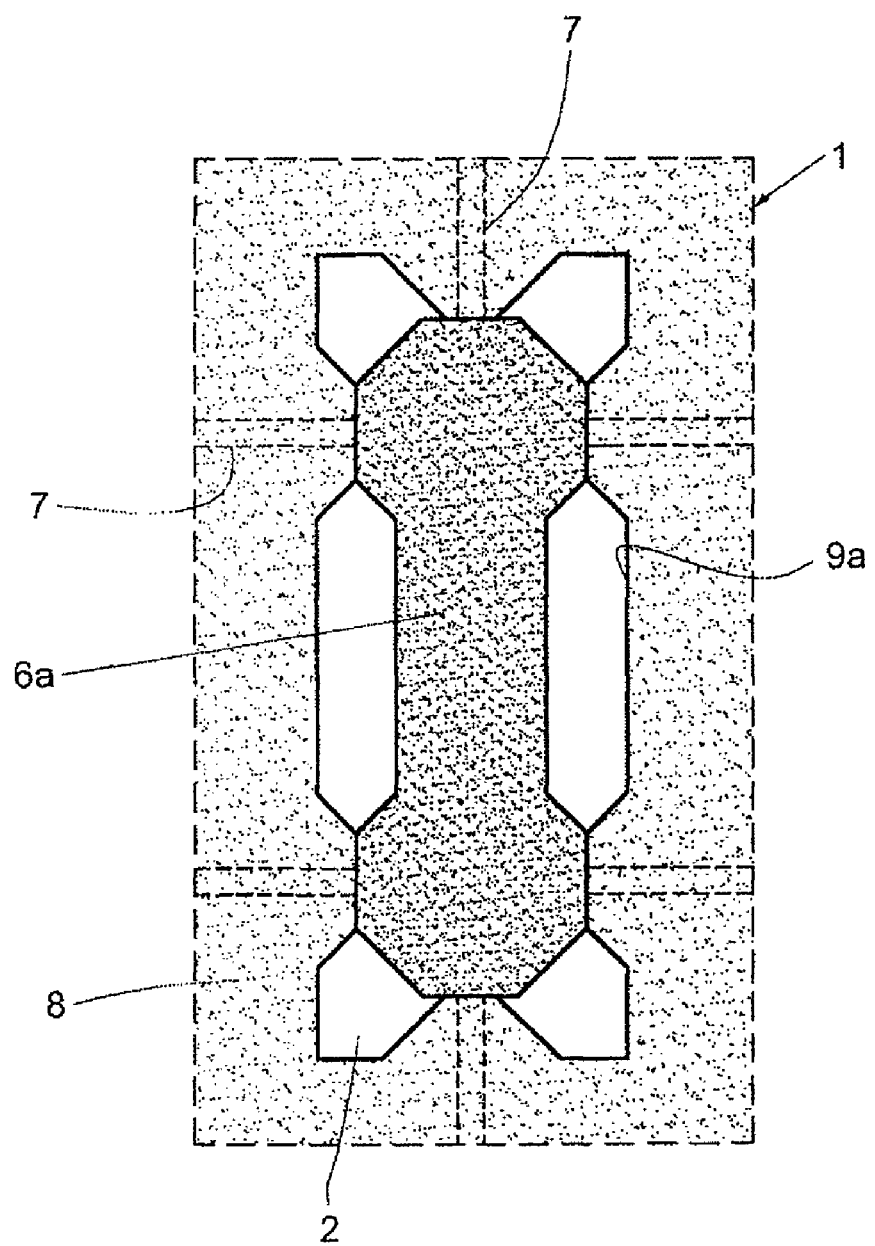
FIG. 11 shows a front view of said wafer showing a variation of embodiment of the step of FIGS. 4 and 5.

According to a variant represented in FIG. 11, it is possible to produce openings 9a that are non-rectangular or formed in such a way that their walls have parts passing through the transitional parts of all the connection branches 7 and conductive areas 6a. In this way, chemical etching of the connection branches 7 allows them to be removed completely.

According to another variant, it is possible to produce openings, the walls of which have parts passing below the transitional parts between all the connection branches and the conductive areas and on the latter.

According to the example that has just been described, the circular or polygonal conductive areas 6b are formed at the same time as the elongated conductive areas 6a. According to a variant, the base layer may be etched to form only the elongated conductive areas 6a and the connection branches 7 connecting them. The conductive areas 6b might then be produced during the etching of the connection branches 7 around the solder blocks 12a by removing the base layer around the solder blocks 12b.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method for fabricating electrical bonding pads on one face of a wafer, comprising:
   producing electrically conductive areas each having an elongated shape including an elongated central part having opposed first and second ends with enlarged end parts at each first and second end;
   depositing a layer of mask material over the electrically conductive areas;
   producing openings in the layer of mask material which extend above said electrically conductive areas, the openings including enlarged end portions having an edge coincident with a peripheral edge of the enlarged end parts of the electrically conductive area and a central portion having an edge which is offset beyond a peripheral edge of the elongated central part of the electrically conductive area;

producing blocks made of a solder material in said openings;

removing the layer of mask material; and heating so as to shape, on the electrically conductive areas, said blocks into substantially domed elongated electrical bonding pads each including enlarged end domed portions joined by an elongated central domed portion, wherein the enlarged end dome portions and the elongated central dome portion have substantially a same height.

2. The method according to claim 1, wherein walls of the openings in the layer of mask material extend along and at a distance spaced from the peripheral edges of the elongated central parts of said electrically conductive areas.

3. The method according to claim 1, wherein heights of the domed elongated electrical bonding pads are approximately the same from one pad to another.

4. The method according to claim 1, wherein the enlarged end parts of the electrically conductive areas have a circular or polygonal shape.

5. A method for fabricating electrical bonding pads on one face of a wafer, comprising:

producing first and second electrically conductive areas, wherein the first electrically conductive area has a generally round shape and the second electrically conductive area has an elongated shape including an elongated central part having opposed first and second ends with enlarged end parts at each first and second end;

depositing a layer of mask material;

producing a first opening in the layer of mask material above and of a same size and shape as the first electrically conductive area;

producing a second opening in the same layer of mask material above and having enlarged end portions with a same size and shape as the enlarged end parts of the second electrically conductive area and having a central portion with a size and shape extending at least partly beyond peripheral edges of the elongated central part of the second electrically conductive area;

producing first and second blocks made of a solder material filling in said first and second openings;

removing the layer of mask material; and heating so as to shape the first and second blocks into substantially domed electrical bonding pads having approximately a same height, wherein the first block is shaped into a generally round dome shape and the second block is shaped into an elongated dome shape having enlarged end domed portions joined by an elongated central domed portion, wherein the enlarged end dome portions and the elongated central dome portion have substantially a same height.

6. The method of claim 5 wherein the first electrically conductive area has a circular or polygonal shape, and the enlarged end parts of the second electrically conductive area also have a circular or polygonal shape.

7. The method of claim 5 wherein the second opening in the layer of mask material has a size and shape such that side walls of the second opening align with at least portions of edges of the enlarged end parts and are spaced away from edges of the elongated central part.

8. A method for fabricating electrical bonding pads on one face of a wafer, comprising:

producing electrically conductive areas each having an elongated shape including an elongated part having opposed first and second ends with an enlarged end part at said first end;

depositing a layer of mask material over the electrically conductive areas;

producing openings in the layer of mask material which extend above said electrically conductive areas, the laterally adjacent openings including an enlarged end portion having an edge coincident with a peripheral edge of the enlarged end part of the electrically conductive area and a central portion having an edge which extends at least partly beyond a peripheral edge of the elongated part of the electrically conductive area;

producing blocks made of a solder material in said openings by electrodeposition in a bath;

removing the layer of mask material; and heating so as to shape, on the electrically conductive areas, said blocks into substantially domed elongated electrical bonding pads each including an enlarged end domed portion joined to an elongated domed portion, wherein the enlarged end domed portion and the elongated domed portion have substantially a same height.

9. The method according to claim 8, wherein the enlarged end parts of the electrically conductive areas have a circular or polygonal shape.

* * * * *